United States Patent [19]
Lieneweg et al.

[11] Patent Number: 5,278,444
[45] Date of Patent: Jan. 11, 1994

[54] PLANAR VARACTOR FREQUENCY MULTIPLIER DEVICES WITH BLOCKING BARRIER

[75] Inventors: Udo Lieneweg, Altadena; Margaret A. Frerking, La Canada; Joseph Maserjian, Valencia, all of Calif.

[73] Assignee: The United States of America as represented by the Administrator of the National Aeronautics and Space Administration, Washington, D.C.

[21] Appl. No.: 842,297

[22] Filed: Feb. 26, 1992

[51] Int. Cl.[5] .......................................... H01L 29/90
[52] U.S. Cl. .................................... 257/476; 257/15; 257/199; 257/480; 257/482; 257/486; 257/506; 257/514; 257/601
[58] Field of Search .............. 257/480, 601, 476, 15, 257/199, 482, 486, 506, 514

[56] References Cited

U.S. PATENT DOCUMENTS

| | | | |
|---|---|---|---|
| 4,394,632 | 7/1983 | Hu | 333/218 |
| 4,410,902 | 10/1983 | Malik | 357/13 |
| 4,672,405 | 5/1987 | Derkits, Jr. | 357/16 |
| 4,682,196 | 7/1987 | Sakai et al. | 357/30 |
| 4,732,873 | 3/1988 | Perbet et al. | 437/101 |
| 4,749,949 | 6/1988 | Albin et al. | 328/16 |
| 4,785,340 | 11/1988 | Nakagawa et al. | 357/35 |
| 4,833,508 | 5/1989 | Ishikawa et al. | 357/4 |
| 4,876,211 | 10/1989 | Kanber et al. | 437/22 |
| 4,954,864 | 9/1990 | Maserjian | 357/30 |
| 4,982,246 | 1/1991 | Polasko et al. | 357/15 |
| 4,994,882 | 2/1991 | Hess et al. | 357/38 |

OTHER PUBLICATIONS

T. Tolmunen, et al., "Theoretical Efficiency of Multiplier Devices," Second International Symposium on Space Terahertz Technology, pp. 197 to 211, (1991).

H-X. L. King, et al., "Millimeter Wave Monolithic Solid State Device Arrays," Second International Symposium on Space Terahertz Technology, pp. 293-305, (1991).

Primary Examiner—Edward Wojciechowicz
Attorney, Agent, or Firm—John H. Kusmiss; Thomas H. Jones; Guy M. Miller

[57] ABSTRACT

A planar frequency tripler comprised of two semiconductor diode structures connected back-to-back by an n+ doped layer (N+) of semiconductor material utilizes an n doped semiconductor material for a drift region (N) over the back contact layer in order to overcome a space charge limitation in the drift region. A barrier layer (B) is grown over the drift region, after a sheet of n-type doping ($N_{sheet}$) which forms a positive charge over the drift region, N, to internally bias the diode structure. Two metal contacts are deposited over the barrier layer, B, with a gap between them. To increase the power output of the diodes of a given size, stacked diodes may be provided by alternating barrier layers and drift region layers, starting with a barrier layer and providing a positive charge sheet at the interface of a barrier on both sides of each drift region layer with n-type δ doping. The stacked diodes may be isolated by etching or ion implantation to the back contact layer N+ and a separate metal contact deposited on each stacked diode.

6 Claims, 7 Drawing Sheets

FIG. 7

PLANAR VARACTOR FREQUENCY MULTIPLIER DEVICES WITH BLOCKING BARRIER

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to planar varactor frequency multiplier devices of the type disclosed in U.S. Pat. No. 4,954,864 assigned to the United States of America as represented by the Administrator of the National Aeronautics and Space Administration which, by this reference, is hereby made a part hereof.

BACKGROUND ART

A need exists to generate a near-millimeter wave radiation of moderate power from a fundamental input wave using solid-state devices in a phased array that combines the outputs of the devices with no ohmic contacts between devices in a two-dimensional grid.

Gallium arsenide Schottky barrier varactor diodes are the classical devices for frequency multiplication in the microwave region. During the last two decades efforts have been made to adapt this device for operation in the millimeter wave region. The most important improvement was the introduction of a moderately doped epitaxial layer on a heavily doped substrate for reduction of series resistance without loss of capacitance swing. However, the Schottky barrier varactor diode is still hampered by significant disadvantages, such as a substantial parasitic series resistance due to the ohmic back contact and the relatively long path from that contact to the active layer, especially when the skin effect becomes important. Another disadvantage is that the second harmonic is mainly generated so that for higher order multiplication expensive idler circuits must be provided.

Figure 1A:
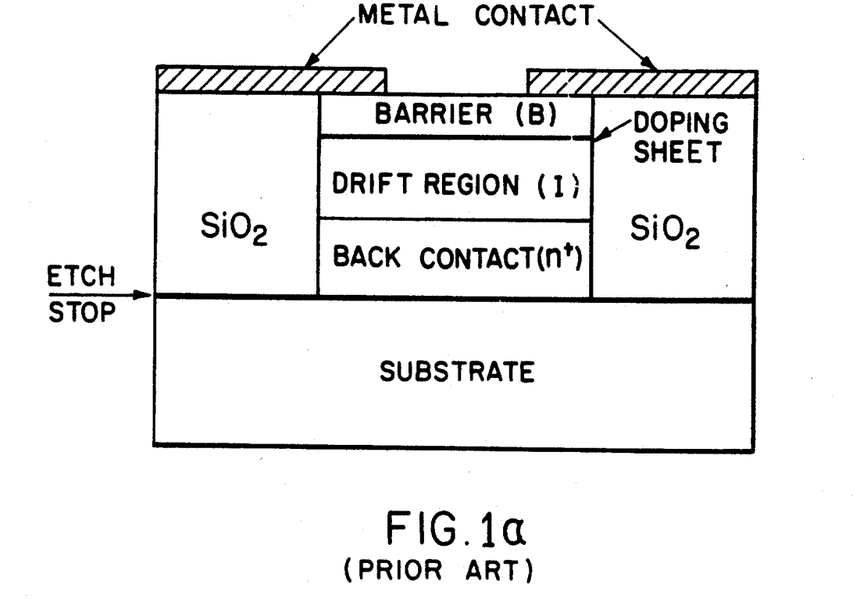
FIG 1a shows schematically a back-to-back diode device structure and FIG. 1b is a diagram of its equivalent circuit.
Figure 1B:
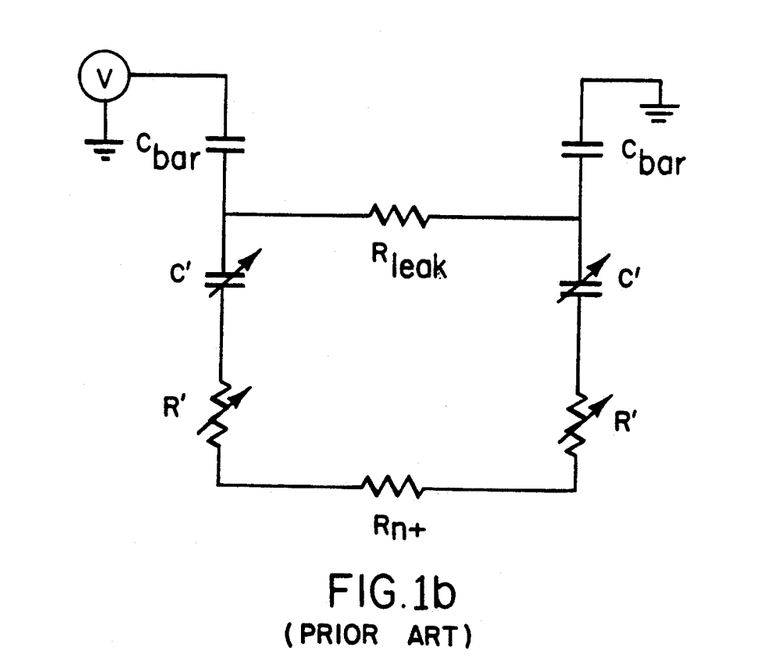

Those disadvantages are overcome by the device disclosed in the aforesaid patent and illustrated schematically in FIG. 1a. It introduces the concept of back-to-back varactor diodes with electron blocking barriers (B) over a positive charge sheet, an intrinsic drift region (I), and a n+ doped region N+ that provides a back contact between the two BIN+ diodes. FIG. 1b is a diagram of its equivalent circuit. However, such a BIN+ device has its limitations; it is space charge limited.

The replacement of the Schottky barrier (which blocks only reverse current) by a barrier involving a positive charge sheet (which blocks also forward current) will enable the BIN+ device to reach the maximum capacitance without any external bias because it is already at an arbitrary reverse bias set by the positive charge sheet. When two such diodes are connected back to back in antiseries through the n+ doped region, a symmetrical capacitance-voltage (C-V) characteristic is obtained, and the structure generates only odd harmonics without idlers. Thus, by integrating two diodes back to back on one chip, back ohmic contacts are eliminated.

In contrast to conventional varactor diodes with a Schottky barrier, BIN+ diodes with a Mott or heterojunction barrier allow operation with a symmetric C-V characteristic of high Cmax/Cmin ratio by connecting two diodes back-to-back.

Each BIN+ back-to-back diode structure may be constructed, top to bottom, of Schottky metal contacts for external connections, a barrier layer with a thickness $d_{bar} \approx 10$ to 30 nm, a charge sheet of n-type doping, a drift region of intrinsic GaAs with a thickness $d_{drift} \approx 50 \ldots 150$ nm, and an n+ layer internally connecting the two diodes in antiseries. As noted above, no bias is required as the sheet doping controls the operating point of the diodes. Thanks to the favorable structure geometry, the parasitic series resistance is minimal and does not degrade due to skin effect.

Lateral isolation from other devices on the same chip can be achieved by mesa etching and deposition of an insulating dielectric, such as $SiO_2$. An additional light etch after metal deposition for surface contacts is recommended in order to reduce near-surface leakage between the metal contacts. The simple, high-yield planar process is appropriate for high-reliability hybrid integration of single devices with planar waveguide coupling and filter structures as well as for on-chip integration with planar antennas in quasi-optically coupled multidiode arrays.

The theoretical models presented here are not intended to be rigorous but rather to serve as guides to the prototype design of such structures. In this spirit, an intrinsic cut-off frequency is estimated for each type of diode from the minimum series capacitance of the drift layer, $C'_{min}$, occurring in depletion and its maximum series resistance, $R'_{max}$, occurring in accumulation, as $$\omega_{ci} = 1/R'_{max}C'_{min}. \tag{1}$$

Parasitic series resistance must be added to $R'_{max}$ for calculation of the extrinsic cut-off frequency. In reality, time averages of series capacitance and resistance affect the harmonic generation of the diodes making it dependent on the signal waveforms and thus on the embedding and driving conditions.

As noted above, when the drift region is intrinsic (I), electrons injected from the back contact layer (N+) carry a space charge limited current with a transit time limited frequency response. The C-V characteristic in this case has a steep transition, $(dC/dV)/C = q/kT$, between $C_{min}$ and $C_{max}$ enabling the "space charge varactor" to generate a frequency spectrum of high harmonic content suitable for triplers and higher order multipliers already at low power levels. With $$C_{min} = \epsilon_{drift} A / d_{drift} \tag{2}$$

and the high-field approximation $$R'_{max} = d^2_{drift} / 2\epsilon_{drift} V_s A, \tag{3}$$

one obtains $$\omega_{ci} = 2v_s / d_{drift}. \tag{4}$$

where A is the area of a single diode and $v_s$ is the effective electron saturation velocity, which may depend on $d_{drift}$ and the field distribution. As $d_{drift}/v_s$ represents the average time needed by an electron to cross the drift region, the response of the BIN+ diode is transit-time limited and does not depend on the electron concentration. Estimates of the value of the average electron velocity in 100 nm GaAs layers range from $0.6 \times 10^7$ cm/s for space averaging to $3 \times 10^7$ cm/s for time averaging. A simulation for transit time devices gave values 1 to $2 \times 10^7$ cm/s. Similar values have been calculated for Si. Table 1 lists the calculated intrinsic cut-off frequencies.

TABLE 1

| | \multicolumn{6}{c}{Calculated for $d_{drift} = 100$ nm and $N = 10^{17}/cm^3$} | | | | | |
|---|---|---|---|---|---|---|
| | $\eta/\eta_o$ | $\mu(N)$ [cm²/Vs] | $v_s$ [cm/s] | $E_{crit}(N)$ [kV/cm] | $f_{ci}$(BIN) [GHz] | $f_{ci}$(BNN) [THz] |
| Si | 12 | 700 | $1 \times 10^7$ | 15 | 300 | 1.5 |
| GaAs | 13 | 4500 | 1 to $2 \times 10^7$ | 2 to 4 | 300 to 600 | 8.6 |

The validity of the BIN+ concept of the aforesaid patent was proven with a single whisker-coupled Si-O₂/Si diode operating as a frequency doubler in a waveguide mount and performing closely to the predictions of a large signal analysis for a stepfunction C-V.

Figure 2:
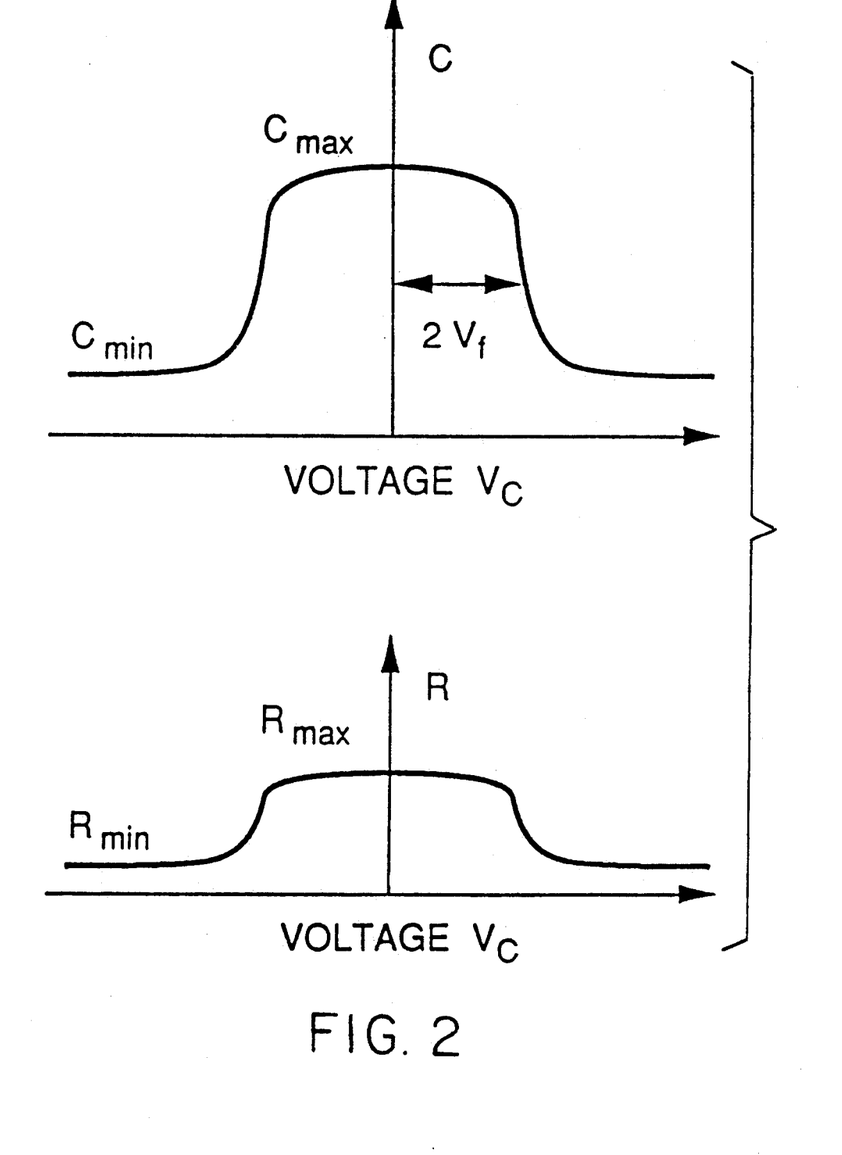
FIG. 2 shows graphs of capacitance C and resistance R of back-to-back BIN+ diodes as a function of voltage drop over capacitance. Halfwidth equals twice the flatband voltage of a single diode.

FIG. 2 shows C-V characteristic curves from a pair of back-to-back BIN+ diodes with characteristic values related to physical diode properties. The maximum capacitance is reached when both diodes are in accumulation, whereas at the minimum capacitance one diode is in accumulation and the other fully depleted, leading to $$C_{max} = C_{bar}/2 \tag{5}$$

$$C_{min} = \frac{C_{min}' C_{bar}/2}{C_{min}' + C_{bar}/2} \tag{6}$$

with $C_{bar} = \epsilon_{bar} A/d_{bar}$ and $C'_{min} = \epsilon_{drift}/d_{drift}$, where A is the area of each single diode, $\epsilon_{BAR}$ is the dielectric constant of the barrier and $\epsilon_{drift}$ is the dielectric constant of the drift region. The halfwidth of the C-V curve is close to $2V_f$, where $V_f$ is called flatband voltage because at that voltage the field at the barrier is zero, marking the transition between accumulation and depletion of the drift region.

Figure 3:
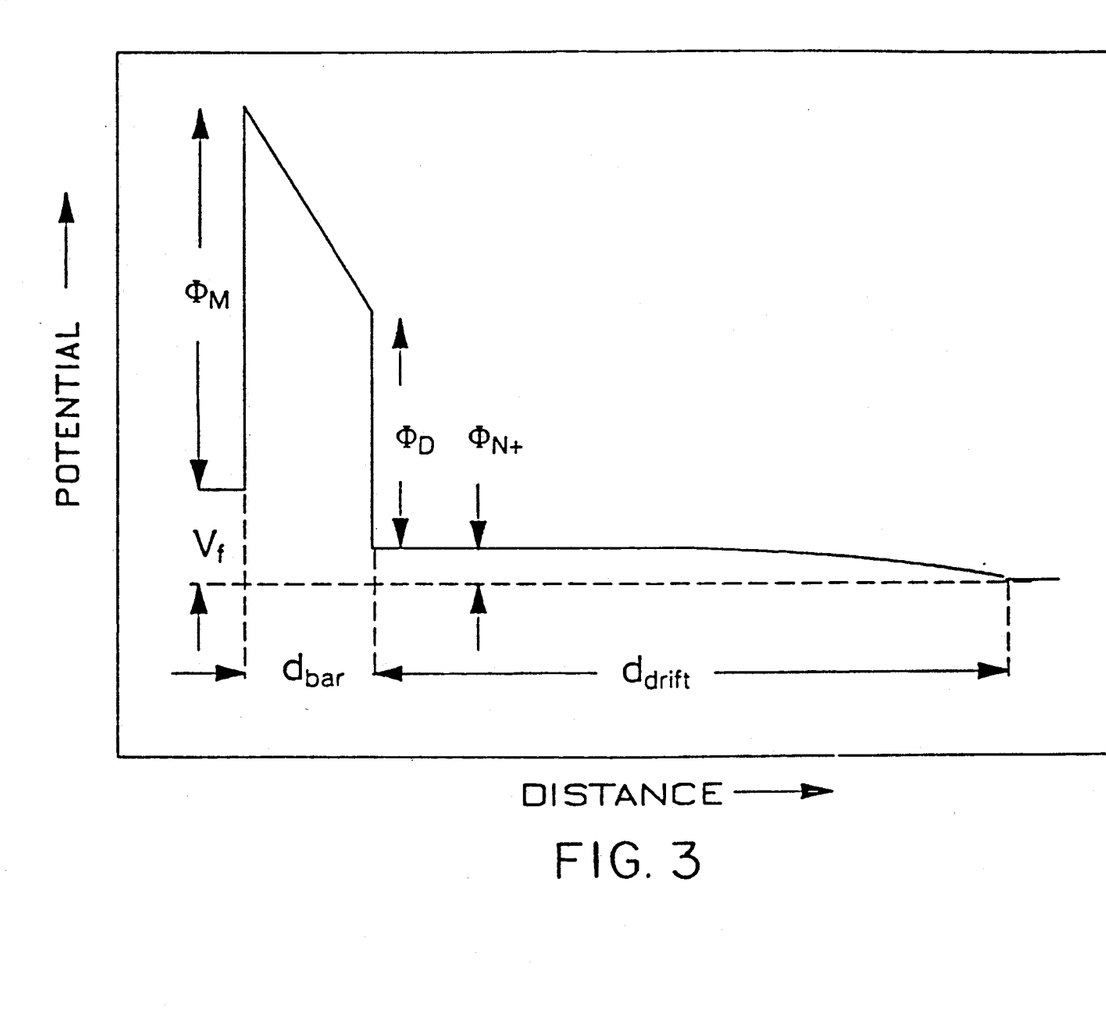
FIG. 3 illustrates electron potential distribution of a single BIN+ diode with a trapezoidal barrier, biased at flatband voltage $V_f$. The field discontinuity between barrier and drift region is controlled by a doping sheet close to that interface.

For the most general case of a trapezoidal barrier, as shown in FIG. 3, the flatband voltage $V_f$ is determined by the following Equation (7) from the n-type doping sheet, $N_{sheet}$, together with the barrier height at the metal interface, $\Phi_M$, the barrier height at the interface with the drift material, $\Phi_D$, and a and N+, the back contact layer, $\Phi_{N+}$ ($\approx 0.1$ V at room temperature).

$$V_f = qN_{sheet}d_{bar}/\epsilon_{bar} + \Phi_D - \Phi_M + \Phi_{N+}. \tag{7}$$

where $$\Phi_{N+} = \frac{2kT}{q} \ln \frac{2d_{drift}}{\pi L_D} \tag{8}$$

with $L_D = \sqrt{2\epsilon_{drift}kT/q^2 n^+}$ being the Debye length of the back contact layer N+. This formation covers several types of barriers which are listed in Table 2. In particular, this discussion refers to the triangular barrier created by the doping sheet in all-GaAs material, i.e., $\Phi_D = 0$, as a Mott barrier.

TABLE 2

| \multicolumn{5}{c}{Properties of various barriers} | | | | |
|---|---|---|---|---|
| Barrier Type | Material | Drift Region | $\Phi_M$[V] | $\Phi_D$[V] | $m_{bar}/m_0$ |
| Mott | GaAs | GaAs | 0.8 | 0 | 0.07 |
| Heterojunction | AlGaAs | GaAs | 1.2 | 0.4 | 0.10 |
| Hetero- | AlAs | GaAs | :π 2.0 | 1.0 | 0.15 |

TABLE 2-continued

| \multicolumn{5}{c}{Properties of various barriers} | | | | |
|---|---|---|---|---|
| Barrier Type | Material | Drift Region | $\Phi_M$[V] | $\Phi_D$[V] | $m_{bar}/m_0$ |
| junction | | | :X 1.4 | 0.6 | 0.19 |
| Oxide | SiO₂ | Si | 3.2 ... 4.1 | 3/2 | 1.0 |

As the capacitance changes, the series resistance also changes, as shown in FIG. 2. The maximum, $$R_{max} = 2R'_{max} + R_{N+}, \tag{9}$$

is the resistance of both drift regions of the back-to-back diodes in accumulation plus the parasitic series resistance, whereas the minimum $$R_{min} = R'_{max} + R_{N+}, \tag{10}$$

is the resistance of only one accumulated diode plus parasitic because the other diode is fully depleted. As a reasonable average value $R = 1.5 R_{max}' + R_{N+}$ has been used in the simulations.

Figure 4:
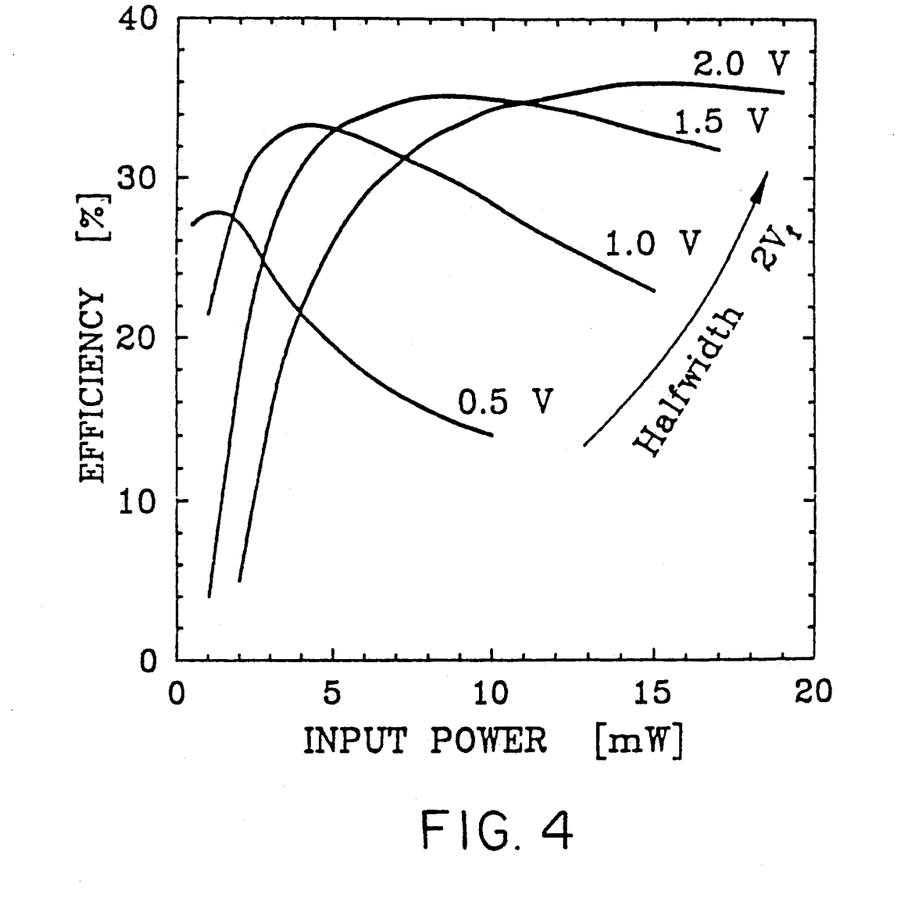
FIG. 4 are graphs of efficiency for a simulated BIN+ tripler to 200 GHz as a function of input power with halfwidth of C-V as a parameter with $C_{max}=15fF$, $C_{min}=5fF$ and $R=20\Omega$.

FIG. 4 shows a simulated result for a tripler to 200 GHz. For a given halfwidth $2V_f$ the efficiency $\eta$ peaks at a certain input power with the peak shifting to higher powers, broadening and reaching a saturation value for larger halfwidths. Furthermore, the input power is related to the peak voltage drop over the capacitance $\hat{V}_c$, by $P_{in} \propto \hat{V}_c$. The condition for maximum efficiency, obtained from many simulations, can be described by $$2V_f = 0.6 \frac{C_{min}}{C_{max}} \hat{V}_C. \tag{11}$$

where $2V_f$ should be much larger than $kT/q$ for a BIN+structure.

Figure 5:
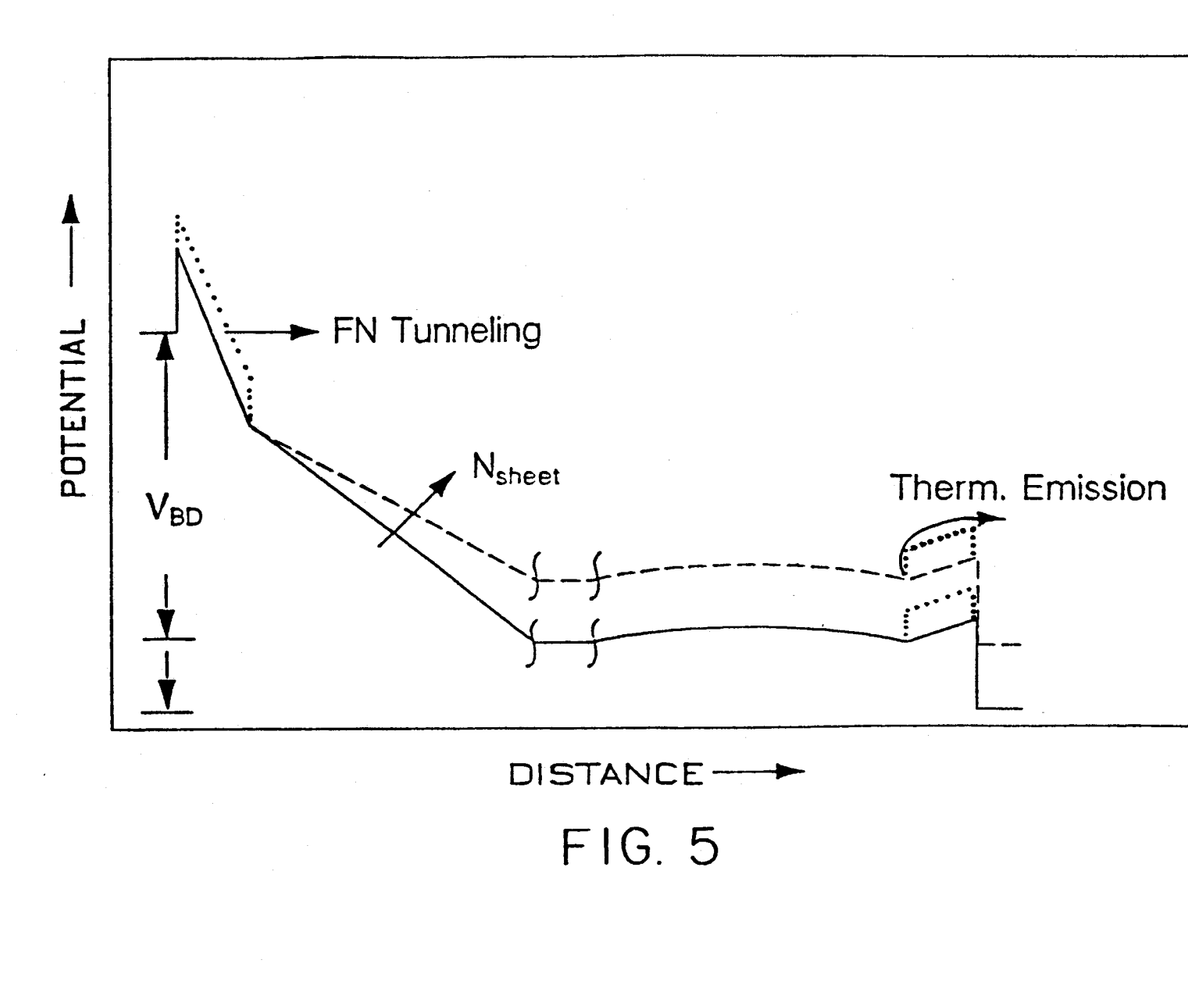
FIG. 5 illustrates potential distribution in back-to-back BIN+ diodes at breakdown voltage $V_{BD}$ caused by tunneling through its reverse biased barrier to show that increased sheet doping decreases $V_{BD}$.

A discussion of what limits $\hat{V}_c$ follows with reference to FIG. 5 where the conduction band edge of back-to-back BIN+ structure with Mott barriers and a 100 nm drift region has been plotted from a PISCES simulation depicting the situation 100 ps after the application of a large voltage step. (The solution after only 10 ps is practically identical as expected for a transit time of the order of 1 ps.) The steady-state solution differs by a decreased voltage drop over the forward biased barrier due to a substantial leakage conductance. The fields are high in the reverse biased diode and low in the forward biased diode as long as the input frequency is much smaller than the cut-off frequency.

The forward biased barrier exhibits a leakage current of density $$j_{TE} = \frac{4\pi q m_{bar} k^2 T^2}{h^3} \exp\left[-\frac{q\Phi_B}{kT}\right]. \tag{12}$$

which is caused by thermionic emission (TE) over the barrier with $m_{bar}$ being its effective mass and $\Phi_B$ its effective height. The leakage current in the reference biased barrier is dominated by Fowler-Nordheim (FN) tunneling with a density $$j_{FN} = \frac{m_0}{m_{bar}} \frac{q^3 E_{bar}^2}{8\pi h \Phi_M} \exp\left(-\frac{8\pi \sqrt{2m_{bar} q}}{3hE_{bar}} \Phi_M^{3/2}\right). \tag{13}$$

which, in contrast to the thermionic current, is a reverse leakage barrier $E_{bar} > 0$. As a consequence, the current rises very sharply with the total applied voltage and will overtake the forward leakage current at a breakdown voltage. Beyond that voltage, the barriers would become highly rectifying in a sense that would lead to a build-up of charge between the barriers, which would shift the flatband voltage.

This functional breakdown voltage is estimated by equating the exponents of Equations (12) and (13). This leads to the barrier breakdown field $$E_{bar,BD} = \frac{8\pi \sqrt{2m_{bar}q\Phi_M}}{3h} \frac{\Phi_M}{\Phi_B} \frac{kT}{q} \quad (14)$$

which at $T = 300k$ reduces to $$E_{bar,BD} = \frac{1.7 \times 10^6}{V^{\frac{1}{2}}cm} \sqrt{\frac{m_{bar}}{m_0}} \Phi_M \frac{\Phi_M}{\Phi_B} \text{ at } T = 300 K. \quad (15)$$

FIG. 5 shows by the solid line triangular peak the effective height of the Mott barrier (around 0.3 V). A dotted line shows the effective height of a heterojunction barrier to be higher and not so thin that current tunnels through the barrier. Thus, the above derivation of the breakdown holds not only for Mott (triangular) barriers but also for the trapezoidal heterojunction and oxide barriers as long as these barriers are not so thin that the current tunnels through the full barrier at breakdown, i.e., $\Phi_M - E_{bar,BD}d_{bar} \leq 0$ must be fulfilled. For these trapezoidal barriers, shown by a dotted line in FIG. 5, which leak only a little in forward direction, it is estimated that $\Phi_B \approx \Phi_D$ as the voltage drop over the forward biased diode will be about $V_f$, which will usually be larger than $\Phi_M - \Phi_D$, of FIG. 3.

The breakdown voltage of a single diode is related to the barrier breakdown field by $$V_{BD,s} \approx E_{bar,BD}\left(\frac{\epsilon_{bar}}{\epsilon_{drift}} d_{drift}\right) - \frac{qN_{sheet}}{\epsilon_{drift}} d_{drift} + \Phi_D - \Phi_M. \quad (16)$$

Applying $Q = \int C dV$ to the single and the back-to-back diodes, the breakdown voltage of the latter becomes $$V_{BD} = \frac{C_{min,s}}{C_{min}} (V_{BD,s} - V_f) + 2V_f \quad (17)$$

with $$\frac{C_{min,s}}{C_{min}} = \frac{d_{bar}}{d_{bar} + d_{drift}} + 1 \quad (18)$$

This derivation assumes that the voltage drop over the barriers is still determined by their capacitance rather than their conductance, which is a good approximation for heterojunction barriers at high frequency operation. (Note that $V_{BD}$ decreases with increase in sheet doping as illustrated by the dashed line in FIG. 5.)

Table 2 above lists the properties of various barriers starting with the simple GaAs Mott barrier, suitable only for low-power applications, and progressing to AlGaAs/GaAs with about 50% Al,AlAs/GaAs and SiO$_2$/Si. The Schottky barrier heights $\Phi_M$ of the III-V compounds have been estimated by the $\frac{2}{3}$-bandgap rule. Note that tunneling through the X-valley is facilitated by the isotropic momentum distribution in the metal, which limits the advantage of a pure AlAs barrier.

With these parameters and the maximum allowed voltage drop over the capacitance, $\max(\hat{V}_c)$, set equal to $V_{BD}$, the results for the AlGaAs/GaAs heterojunction barrier tripler in the following Table 3 have been obtained. The area has been chosen to achieve matchable impedance levels.

TABLE 3

| Simulated Performance of a AlGaAs/GaAs BIN+ Tripler to 200 GHz | |
|---|---|
| $d_{bar}$ [nm] | 20 |
| $d_{drift}$ [nm] | 80 |
| $N_{sheet}$ [cm$^{-2}$] | $5.5 \times 10^{12}$ |
| A [$\mu$m$^2$] | 6 |
| $C_{max}$ [fF] | 15 |
| $C_{min}$ [fF] | 5 |
| R [$\Omega$] | 20 |
| $2V_f$ [V] | 2.0 |
| $V_c$ [V] | 11.5 |
| $P_{in}$ [mV] | 19 |
| $\mu$ [%] | 35.5 |
| $P_{out}$ [mV] | 6.7 |
| $R_1$ [$\Omega$] | 48 |
| $X_1$ [$\Omega$] | 300 |
| $R_3$ [$\Omega$] | 35 |
| $X_3$ [$\Omega$] | 50 |

Since already $V_f \approx 1V$ the effective height of the forward biased heterojunction barrier, $\Phi_B$, was set to $\Phi_D$. The area has been chosen to achieve matchable impedance levels.

STATEMENT OF THE INVENTION

The space charge limitation of submillimeter frequency multiplier devices of the BIN+ type is overcome by a BNN+ diode structure comprising an n+ doped layer of semiconductor material functioning as a low resistance back contact, a layer of semiconductor material with n-type doping functioning as a drift region grown on the back contact layer, a $\delta$ doping sheet forming a positive charge at the interface of the drift region layer with a barrier layer, and a surface metal contact. The layers thus formed on an n+ doped layer may be divided into two isolated back-to-back BNN+ diodes by etching or ion implantation and separately depositing two surface metal contacts.

By repeating the sequence of the drift region layer and the barrier layer with a $\delta$ doping sheet at the interface between the drift and barrier layers, a plurality of stacked diodes are formed. By etching or otherwise dividing the stacked layers into two stacks down to the n+ doped back contact layer, such as by ion implantation, two isolated multidiode stacks are provided for the back-to-back diodes antiseries connected for greater output power without sacrificing the advantage of two single diodes connected back to back in antiseries by the internal n+ doped contact layer. When single or stacked diodes are provided on a single chip, they may be isolated by etching or ion implanting channels down to the n+ doped layer and, in the case of etching, filling the channels with insulating dielectric material before depositing a pattern of metal for surface contacts. In the case of stacked diodes, back-to-back diode isolation may be carried out at the same time the stacked layers are isolated to divide them into two stacked diodes connected back to back.

The novel features that are considered characteristic of this invention are set forth with particularity in the appended claims. The invention will best be understood from the following description when read in connection with the accompanying drawings.

DETAILED DESCRIPTION OF THE INVENTION

In the present embodiment, a heterojunction barrier is used instead of a Mott barrier because it is superior in withstanding breakdown as indicated by the trapezoidal (dotted line) barrier versus the triangular (solid line) barrier in FIG. 5

Figure 6:
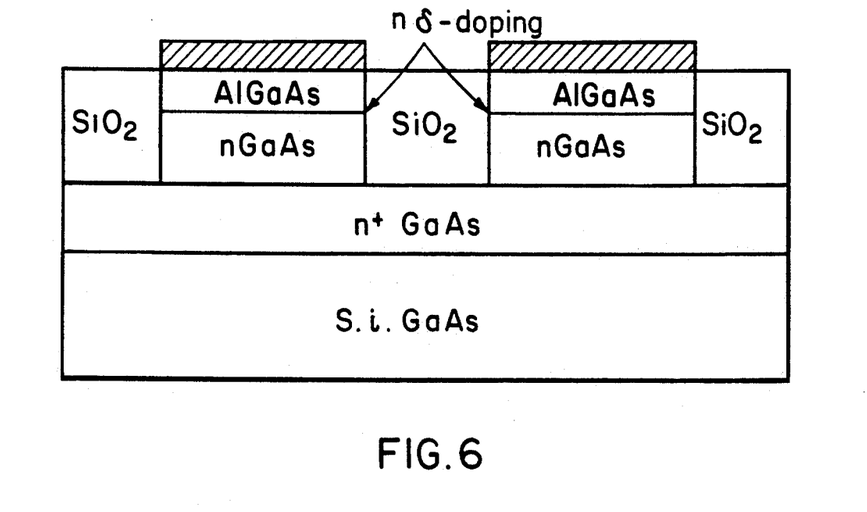
FIG. 6 illustrates two back-to-back BNN+ diodes for a frequency tripler in accordance with the present invention.

It has been discovered that if enough n-type bulk doping is added to the drift region to create a BNN+ diode shown in FIG. 6, the current is no longer space charge limited. The resistance of the undepleted drift region becomes $$R'_{max} = \rho d_{drift}/A. \quad (19)$$

where $\rho = 1/qN\mu$ is the resistivity, which in turn depends on the doping and the electron mobility. The intrinsic cut-off frequency becomes $$\omega_{ci} = 1/R'_{max}C'_{min} = 1/\epsilon\rho. \quad (20)$$

i.e., determined by dielectric relaxation. Unfortunately, the mobility and with it the relaxation time degrades when the field in the drift region exceeds a critical field, $E_{crit}$. Although the mobility has a complex functional dependence on the spatial and temporal distribution of the electric field, a simple monotonous model $$\mu(E_{drift}) = \frac{\mu_0}{1 + E_{drift}/E_{crit}} \quad (21)$$

may be used with a properly adjusted $E_{crit} = v_s/\mu_0$ as an engineering guide. The design goal was to avoid $E_{drift} > E_{crit}$ as much as possible. Table 1 gives numerical values for the intrinsic cut-off frequency of BNN+ diodes with $N=10^{17}/cm^3$ at low fields and the critical field for comparison with BIN+ diodes. These cut-off frequencies are clearly much higher than the ones for the BIN+ diodes but are restricted to fairly low fields.

The transition from space charge limited behavior occurs when the Debye length $$L_{Debye} = \sqrt{2\epsilon_{drift}kT/q^2N} \quad (22)$$

becomes less than $d_{drift}$. As a side effect, the transition from high to low capacitance becomes more gradual, i.e., with a long depletion tail, which can be described by $$C = \frac{C_{bar}}{\sqrt{1 + a(V - V_f)}}, \quad (23)$$

where $a = 2C^2_{bar}/qN\epsilon_{drift}A^2$. This approximation holds for $V < V_f - 4kT/q$, where the flatband voltage is still given by Equation (7), but now with $$\Phi_{N+} = \frac{kT}{q} \ln N_c/N. \quad (24)$$

where $N_c$ is the effective conduction band density of states. The graduation of the C-V curve should have little effect on tripling for high enough powers as long as the diodes "punch through." i.e., the maximum depletion width reaches $d_{drift}$. If punch through is reached exactly when the barrier breaks down, then $$V_{BD,s} \approx E_{bar}\left(\frac{\epsilon_{bar}}{\epsilon_{drift}} \frac{d_{drift}}{2} + d_{bar}\right) - \quad (25)$$

$$\frac{qN_{sheet}}{\epsilon_{drift}} \frac{d_{drift}}{2} + \Phi_D - \Phi_M.$$

i.e., a reduction of almost a factor 2 in comparison to the BIN+ if $N_{sheet}$ is not reduced.

Table 4 below compares the properties BIN+ and BNN+ diodes with the intrinsic cut-off frequency defined as

TABLE 4

| Comparison of BIN+ and BNN+ diodes | |
|---|---|
| BIN+ ($L_{Debye} > d_{drift}$) | BNN+ ($L_{Debye} < d_{drift}$) |
| Steep transition with large constant slope (dC/dV)/C = q/kT | Gradual transition with long tail $C \propto 1/\sqrt{V}$ |
| High harmonic content at low power | 3rd harmonic little effected at high power |
| Space charge n(x,V) injected into drift region N from N+ layer | n = N in undepleted drift region n − 0 in depleted part |
| $R_{max}' = d_{drift}^2/2\epsilon_{drift}V_sA$ Transit time limited response | $R_{max}' = d_{drift}(1 + E_{drift}/E_{crit})q N\mu A$ Relaxation time limited response |
| $\omega_{ci} = 2v_s/d_{drift}$ for $E_{drift} > E_{crit} = v_s/\mu$ | $\omega_{ci} = 1/\epsilon\rho(1 + E_{drift}/E_{crit}$ with $1/\rho = qN\mu$ |
| No space charge in depletion → average field at barrier | Positive space charge in depletion → higher than avg. field at barrier → lower breakdown voltage |
| Wide power range of moderate efficiency | Narrower power range of high efficiency |

Table 1 above gives numerical values for the intrinsic cut-off Si BIN+ and GaAs BNN+ diodes that show the superiority of GaAs BNN+ diodes at low fields.

As noted hereinbefore, the relaxation time degrades when the field in the drift region exceeds the critical field. The formulas given in Table 4 are based on the simple monotonous model for the field dependent mobility given by Equation (21). Estimates of the value of the average electron velocity in 100 nm GaAs layers range from $0.6 \times 10^{17}$ cm/s for space averaging to $3 \times 10^{17}$ cm/s for time averaging. A simulation for transit time devices gave values $1 \ldots 2 \times 10^{17}$ cm/s.

Figure 7:
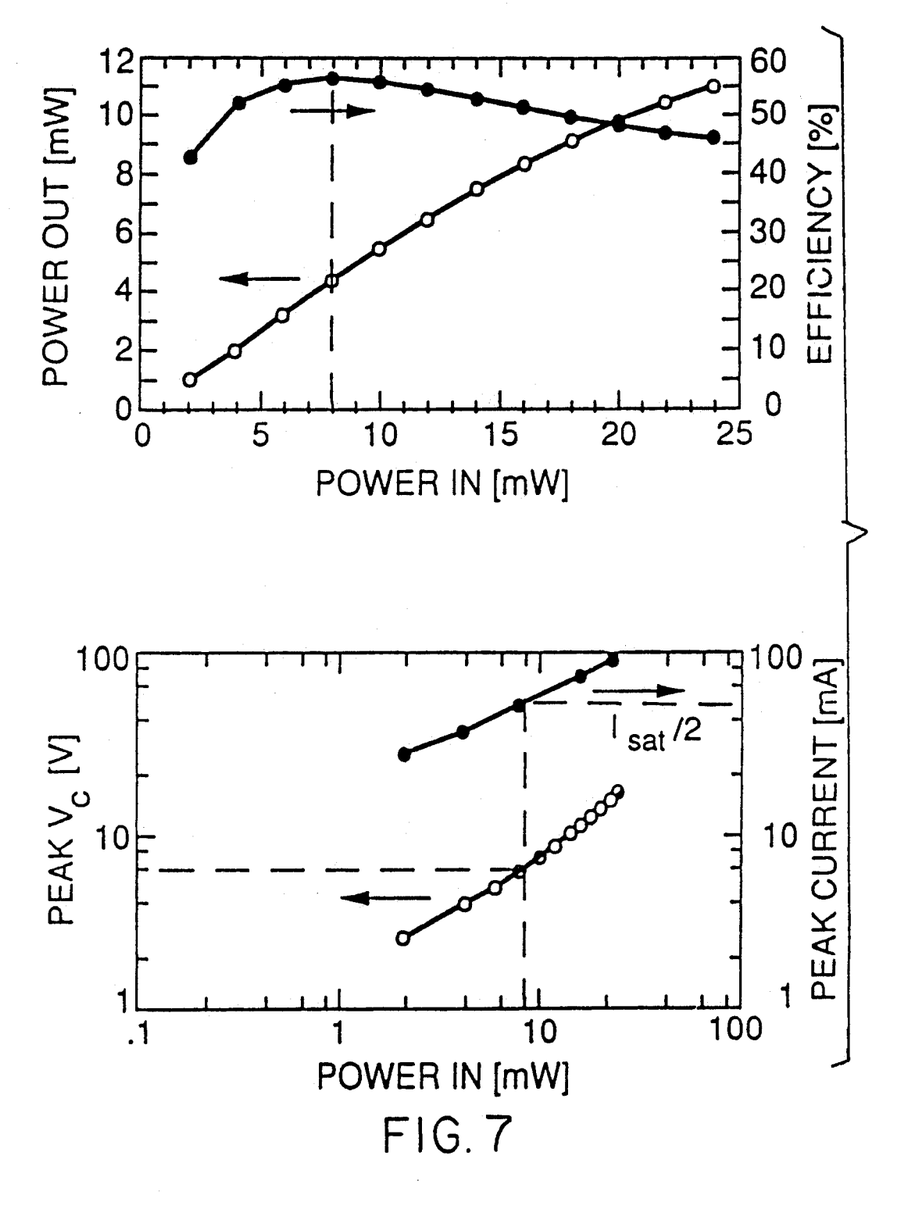
FIG. 7 shows graphs of simulated performance data for BNN+ frequency tripler of FIG. 6 with $C_{max}=30fF$, $C_{min}=11fF$ and $R=5\Omega$.

For large signal simulations, it is easier to monitor the total current rather than the field in the drift region. Since, according to Equation (21), the current reaches 0.5 of its saturation value at the critical field, this should be the maximum current allowed to flow in the diode without serious degradation in the frequency response. FIG. 7 shows simulated results of a back-to-back AlGaAs/GaAs BNN+ tripler to 200 GHz with $N=2.5 \times 10^{17}$ cm$^{-3}$, $d_{bar}=20$ nm, $d_{drift}=100$ nm, $N_{sheet}=4 \times 10^{12}$ cm$^{-2}$, and $A=13$ μm. The assumed series resistance of 5 Ω is largely due to the parasitic series resistance of the back region with $N^+ = 3 \times 10^{18}$/cm$^3$. Improved doping methods are likely to bring this resistance below 2 Ω. The maximum current is calculated as $$I_{sat}/2 = qNv_sA/2 = 50 mA. \qquad (26)$$

This restricts the maximum input and output powers to $P_{in}=8$ mW and $P_{out}=4.5$ mW. A still higher doping of the drift region would cause the peak voltage to exceed the breakdown limit. Thus, increasing the doping to $2.5 \times 10^{17}$ cm$^{-3}$ increases the maximum current to 50 mA and input and output power to about 8 mW and 4.5 mW, respectively.

Figure 8:
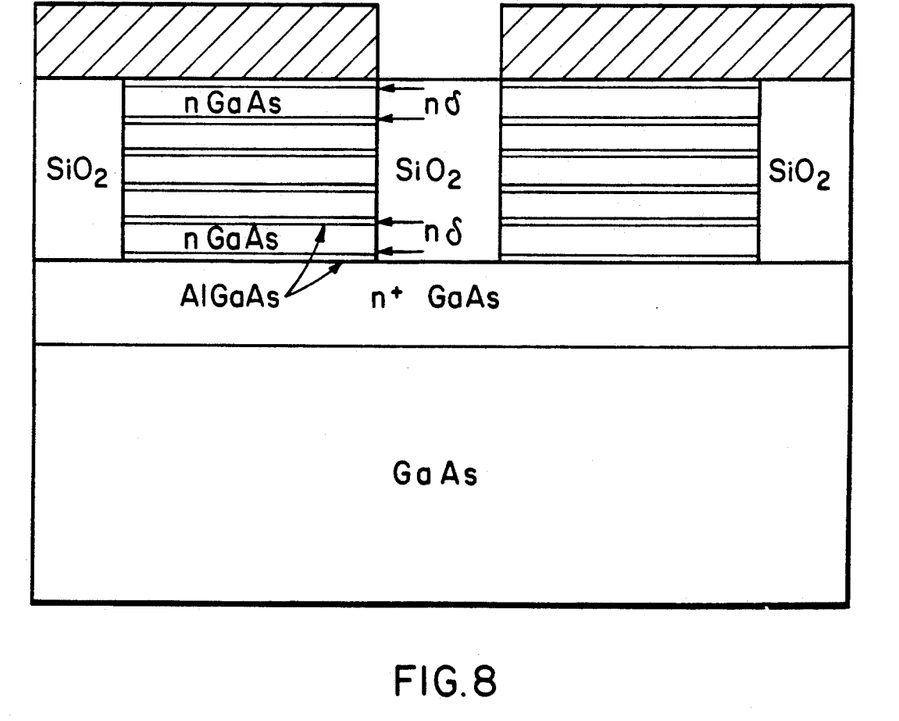
FIG. 8 illustrates a plurality of diodes stacked into two isolated stacks over one n+ contact layer to form back-to-back BNN+ diodes of higher power capability.

Despite the higher tripling efficiency of the BNN+ structure, its achievable output power per unit device area is not higher than that of the BIN+. The power levels ($\alpha A$) could be increased by increasing the area if lower impedance levels ($\alpha 1/A$) could be matched. Another approach would be to effectively replace each BNN+ diode by a stack of BNN+ diodes in series as shown in FIG. 8 in order to bring the impedance up again. After epitaxially growing the back contact (n+ GaAs) layer, the layers of n-type GaAs for the drift regions and AlGaAs for the barriers are alternatively grown for the stacked diodes with n-type δ doping sheets on the two each drift region (n GaAs) layer.

The n-type δ doping at the interface of the n GaAs layers with adjacent AlGaAs barriers is $1.2 \times 10^{12}$/cm$^2$, except at the interface of the last n GaAs layer on the stack and AlGaAs barrier between it and the metal contact, which is $2.1 \times 10^{12}$/cm$^2$. The n-type doping of each GaAs layer is $1.12 \times 10^{17}$/cm$^3$. The thickness, $d_{drift}$, of the GaAs layers is 225 nm, and the thickness, $d_{bar}$, of the barrier layers is 56.2 nm. The device parameters were optimized for maximum power output at a trebling frequency of 200 GHz.

No metal or N+ layers would be necessary inside the stacks for the stacked diodes. A single metal contact for each stack of diodes directly over the last barrier layer grown completes the back-to-back stacked BNN+ diodes. Once the structure of the device is completed, the substrate may be removed by etching. The device approaches the configuration of a stack of single barrier varactors while preserving the planarity with Schottky contacts at the surface barriers. Thus, whereas back-to-back BNN+ triplers are similar in their performance to overdriven Schottky barrier varactor triplers with carefully engineered back contacts and idlers, the stacked BNN+ structure provides higher power capability while maintaining the simplicity of circuit integration.

Although particular embodiments of the invention have been described and illustrated herein, it is recognized that modifications and variations may readily occur to those skilled in the art. Consequently, it is intended that the claims be interpreted to cover such modifications and variations.

We claim:

1. A semiconductor diode structure on a substrate useful for harmonic generation of millimeter or submillimeter wave radiation from a fundamental input wave comprising a layer of n+ doped semiconductor material on said substrate, a layer of n doped semiconductor material forming a drift region on said n+ doped layer, a sheet of positive charge formed by surface doping said n doped layer on a surface thereof opposite said n+ doped layer, and a barrier layer formed over said sheet of doping by a layer of electrically insulating material a surface metal contact being deposited over said barrier layer.

2. A semiconductor diode structure as defined in claim 1 including a second identical semiconductor diode structure on said substrate with a separate surface metal contact deposited over said barrier layer of said second semiconductor diode structure with a gap between both surface metal contacts to form two antiseries back-to-back diodes.

3. A semiconductor diode structure as defined in claim 1 wherein said back contact layer of n+ doped semiconductor is GaAs, said drift region layer of semiconductor material is n doped GaAs, said barrier layer of semiconductor material is AlGaAs, and said sheet doping at an interface of said drift region layer and said barrier layer of semiconductor material is n-type.

4. A semiconductor diode structure as defined in claim 3 including a second identical semiconductor diode structure on said substrate with a separate surface metal contact deposited over said barrier layer of said second semiconductor diode structure with a gap between both said surface contacts to form two antiseries back-to-back diodes.

5. A semiconductor diode structure as defined in claim 3 wherein said drift region layer and said barrier layer with said n-type doping sheet therebetween of said first diode structure are electrically isolated from said drift region layer and said barrier layer with said n-type doping sheet therebetween to form two separate diodes connected back-to-back in antiseries.

6. A semiconductor diode structure as defined in claim 5 wherein each separate diode includes a plurality of drift region layers ad barrier layers alternated in sequence starting with a barrier layer and concluding with a barrier layer, and a n-type doping sheet formed at each interface between a barrier layer and each drift region layer.

* * * * *